US012588178B2

(12) United States Patent      (10) Patent No.:   US 12,588,178 B2

Oyama et al.      (45) Date of Patent:    Mar. 24, 2026

(54) PRODUCTION SYSTEM

(71) Applicant: FUJI CORPORATION, Chiryu (JP)

(72) Inventors: Shigeto Oyama, Kariya (JP); Haruna Narita, Higashiura-cho (JP)

(73) Assignee: FUJI CORPORATION, Chiryu (JP)

( * ) Notice: Subject to any disclaimer, the term of this patent is extended or adjusted under 35 U.S.C. 154(b) by 668 days.

(21) Appl. No.: 17/995,420

(22) PCT Filed: Apr. 9, 2020

(86) PCT No.: PCT/JP2020/016012

§ 371 (c)(1),
(2) Date: Oct. 4, 2022

(87) PCT Pub. No.: WO2021/205612

PCT Pub. Date: Oct. 14, 2021

(65) Prior Publication Data

US 2023/0171933 A1     Jun. 1, 2023

(51) Int. Cl.
    *B23P 19/00*      (2006.01)
    *G05B 19/418*     (2006.01)
    *H05K 13/02*      (2006.01)
    *H05K 13/04*      (2006.01)
    *H05K 13/08*      (2006.01)

(52) U.S. Cl.
    CPC ....... *H05K 13/021* (2013.01); *G05B 19/4183* (2013.01); *H05K 13/0417* (2013.01); *H05K 13/086* (2018.08)

(58) Field of Classification Search
    CPC ............. G05B 19/4183; H05K 13/021; H05K 13/0417; H05K 13/086; F16P 3/144; Y02P 90/02
    See application file for complete search history.

(56) References Cited

U.S. PATENT DOCUMENTS

| | | | | |
|---|---|---|---|---|
| 11,291,147 | B2 * | 3/2022 | Kawai | H05K 13/0417 |
| 11,457,551 | B2 * | 9/2022 | Brown | H05K 13/0495 |
| 12,246,527 | B2 * | 3/2025 | Yokoi | H05K 3/3485 |
| 2020/0103872 | A1 | 4/2020 | Kuroda et al. | |

FOREIGN PATENT DOCUMENTS

| | | |
|---|---|---|
| EP | 2 874 481 A1 | 5/2015 |
| EP | 3 417 991 A1 | 12/2018 |
| WO | WO 2019/016924 A1 | 1/2019 |
| WO | WO 2019/176038 A1 | 9/2019 |

OTHER PUBLICATIONS

International Search Report issued Jul. 7, 2020 in PCT/JP2020/016012 filed on Apr. 9, 2020, 2 pages.

* cited by examiner

*Primary Examiner* — Paul D Kim

(74) *Attorney, Agent, or Firm* — Oblon, McClelland, Maier & Neustadt, L.L.P.

(57) ABSTRACT

A production system includes a first production line and a second production line arranged in parallel with each other, and a first feeder exchange device and a second feeder exchange device respectively provided in each production line at an interval with which the first feeder exchange device and the second feeder exchange device can pass by each other. When the production is stopped, the first feeder exchange device and the second feeder exchange device stop at intervals of a predetermined distance or more in a board conveyance direction.

7 Claims, 17 Drawing Sheets

PRODUCTION SYSTEM

TECHNICAL FIELD

The present specification discloses a production system.

BACKGROUND ART

Conventionally, there has been known a production system including multiple component mounting machines that mount components aligned in a conveyance direction of a board and supplied from a feeder on the board, and a loader that moves in the conveyance direction of the board to replenish a necessary feeder to each component mounting machine or collect a used feeder (for example, refer to Patent Literature 1). The loader includes a monitoring sensor that monitors the presence or absence of an obstacle (operator). The loader travels toward a work position when the obstacle is not detected by the monitoring sensor, and stops traveling when the obstacle is detected by the monitoring sensor. Then, when the obstacle is detected by the monitoring sensor while the loader is stopped, the loader restarts traveling.

PATENT LITERATURE

Patent Literature 1: WO 2019/016924

BRIEF SUMMARY

Technical Problem

Incidentally, some production systems include multiple production lines arranged in parallel with each other, and multiple loaders (feeder exchange devices) provided in each production line. In this production system, in order to save space, it is conceivable to narrow an interval between multiple production lines while securing an interval between adjacent production lines at which the loaders can pass by each other. However, in such a production system, when the production is stopped, each loader may stop at an overlapping position in the board conveyance direction between adjacent production lines. In this case, a path of the operator is closed by the loader, so that the operator cannot pass between the production lines.

A main object of the present disclosure is to provide a production system including a first production line and a second production line arranged in parallel with each other, and a first feeder exchange device and a second feeder exchange device respectively provided in each production line at an interval with which the first feeder exchange device and the second feeder exchange device can pass by each other, in which a space through which a person can pass can be secured between the production lines when production is stopped even if an interval between the production lines is narrowed.

Solution to Problem

The present disclosure adopts the following means to achieve the main object described above.

A production system of the present disclosure includes a first production line including multiple component mounting machines that are arranged in a board conveyance direction, are provided with attachable and detachable sections to and from which feeders are attached and detached, and mount components supplied from the feeders mounted on the attachable and detachable sections on a board; a second production line including multiple component mounting machines that are arranged in parallel with the first production line, are provided with attachable and detachable sections so as to face the attachable and detachable sections of the first production line, and mount components supplied from feeders mounted on the attachable and detachable sections on the board; a first feeder exchange device configured to move in an alignment direction of each component mounting machine of the first production line and exchange the feeder by attaching and detaching the feeder to and from the attachable and detachable section of each component mounting machine of the first production line; and a second feeder exchange device configured to move in an alignment direction of each component mounting machine of the second production line at an interval that allows the second feeder exchange device to pass by the first feeder exchange device and exchange the feeder by attaching and detaching the feeder to and from the attachable and detachable section of each component mounting machine of the second production line, in which when a production is stopped, the first feeder exchange device and the second feeder exchange device are stopped at an interval of a predetermined distance or more from each other in the board conveyance direction.

A production system of the present disclosure includes a first production line and a second production line arranged in parallel with each other, and a first feeder exchange device and a second feeder exchange device respectively provided in each production line at an interval with which the first feeder exchange device and the second feeder exchange device can pass by each other. When the production is stopped, the first feeder exchange device and the second feeder exchange device are stopped at intervals of a predetermined distance or more from each other in the board conveyance direction (extending direction of the production line). Therefore, even if the interval between the production lines is narrowed, it is possible to provide a production system capable of securing a space through which a person can pass between the production lines when the production is stopped.

DESCRIPTION OF EMBODIMENTS

Figure 1:
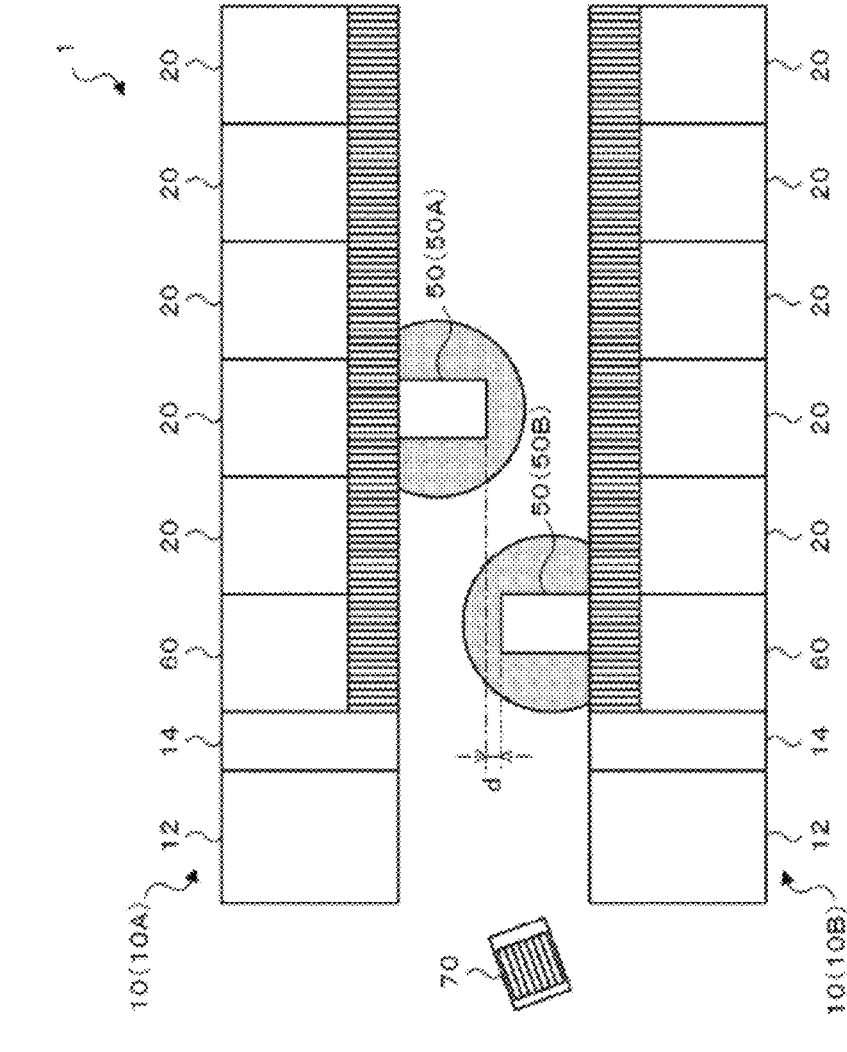
FIG. 1 is a schematic configuration view of a production system according to a first embodiment.
Figure 2:
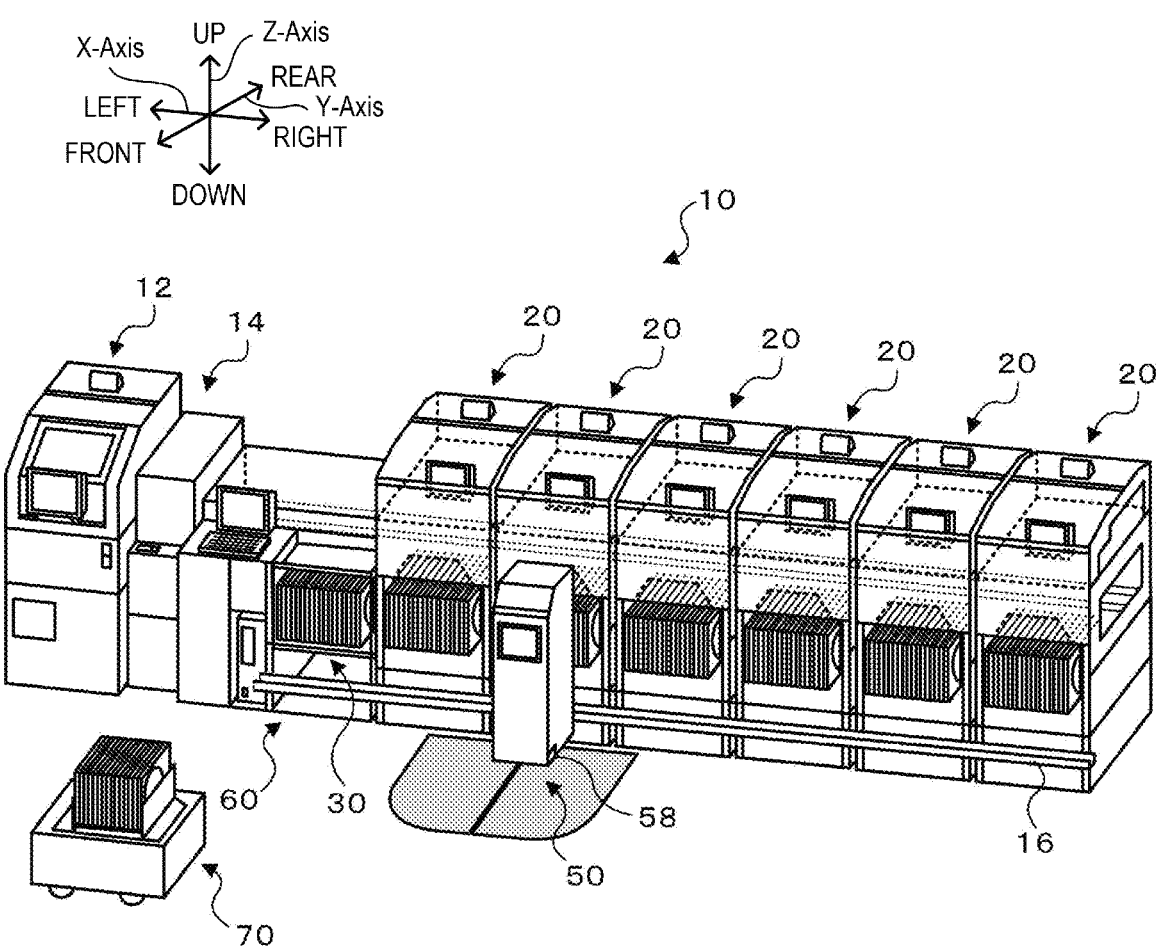
FIG. 2 is a schematic configuration view of a production line.
Figure 3:
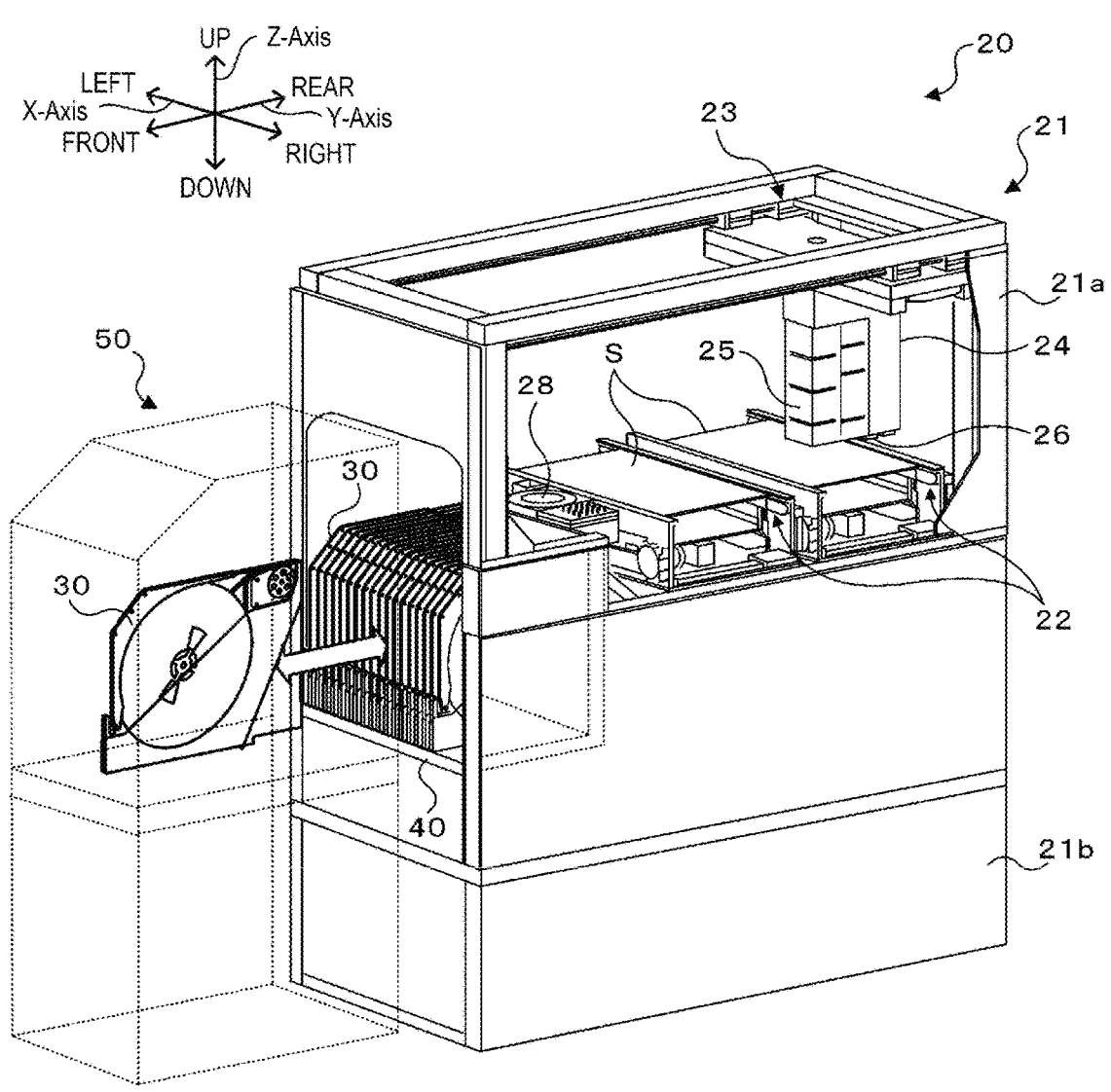
FIG. 3 is a schematic configuration view of a component mounting machine.
Figure 4:
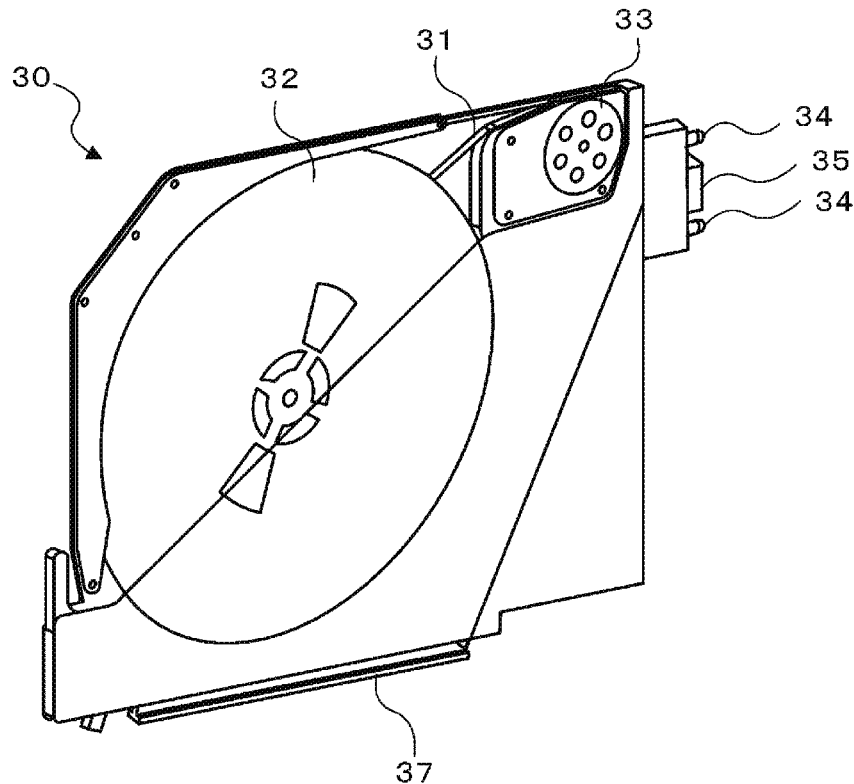
FIG. 4 is a schematic configuration view of a feeder.
Figure 5:
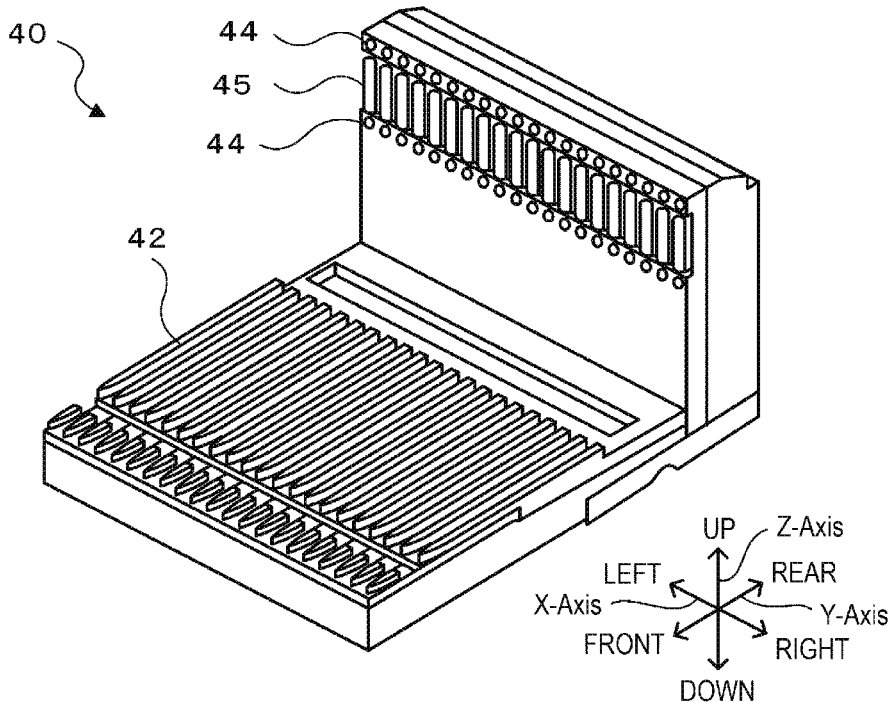
FIG. 5 is an appearance perspective view of a feeder base.
Figure 6:
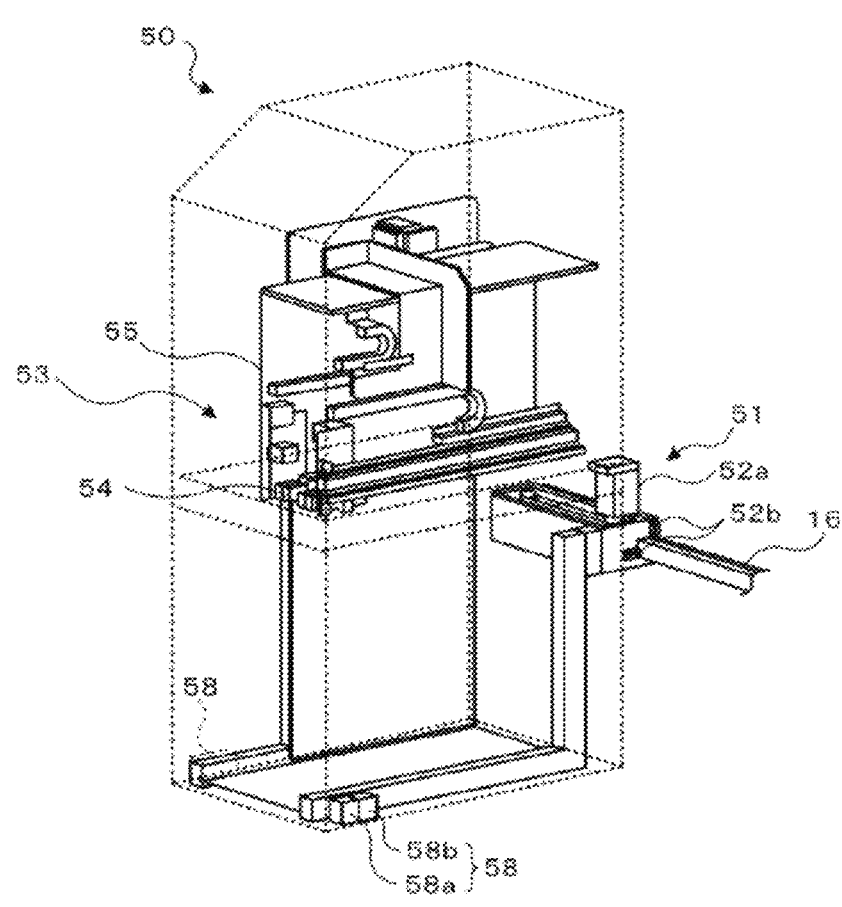
FIG. 6 is a schematic configuration view of a loader.
Figure 7:
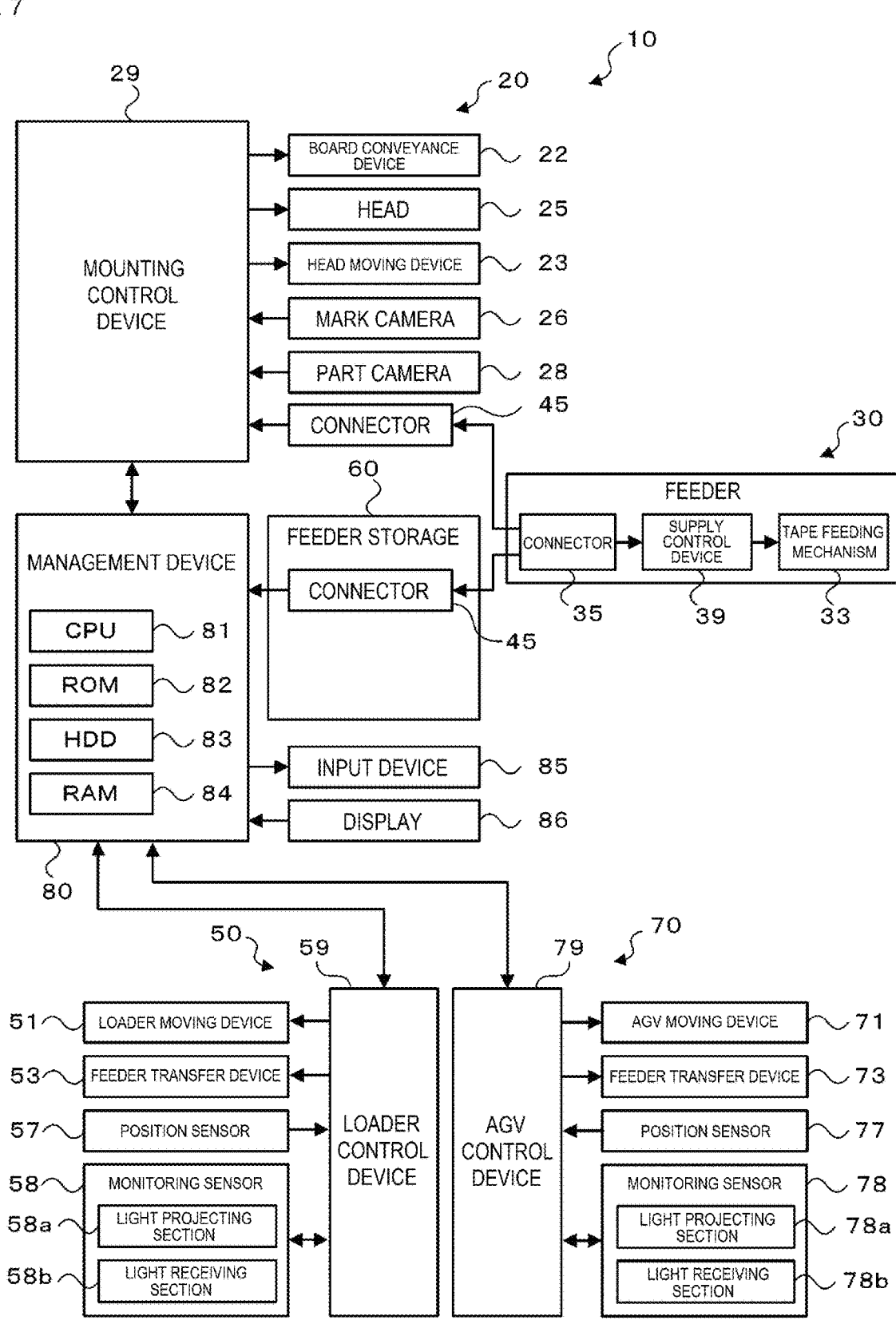
FIG. 7 is a block diagram illustrating an electrical connection relationship of a production system.

Next, an embodiment of the present disclosure will be described while referring to accompanying drawings. FIG. 1 is a schematic configuration view of a production system according to a first embodiment. FIG. 2 is a schematic configuration view of a production line. FIG. 3 is a schematic configuration view of a component mounting machine. FIG. 4 is a schematic configuration view of a feeder. FIG. 5 is an appearance perspective view of a feeder base. FIG. 6 is a schematic configuration view of a loader. FIG. 7 is a block diagram illustrating an electrical connection relationship of the production system. In FIGS. 2 and 3, a left-right direction is set as an X-axis direction, a front-rear direction is set as a Y-axis direction, and an up-down direction is set as a Z-axis direction.

As illustrated in the drawing, production system 1 according to the first embodiment includes multiple production lines 10 (first production line 10A and second production line 10B) arranged in parallel with each other, loader 50 (first loader 50A and second loader 50B) respectively disposed in each production line 10, AGV 70, and management device 80 that manages the entire system. In the first embodiment, both ends of first production line 10A and second production line 10B are opened. A person (operator) or AGV 70 can freely travel between the lines between first production line 10A and second production line 10B.

Each production line 10 is for producing a product in which a component is mounted on board S on which solder is printed. As illustrated in FIG. 2, each production line 10 includes printing device 12, print inspection device 14, multiple component mounting machines 20, mount inspection device (not illustrated), and feeder storage 60. These constitute production line 10 by being aligned in the conveyance direction of board S. Printing device 12 is a device for printing solder on board S. Print inspection device 14 is a device for inspecting a state of the solder printed by printing device 12. Multiple component mounting machines 20 are devices that mount the components supplied from feeder 30 mounted on feeder base 40, on board S. The mount inspection device is a device that inspects a mounting state of the components mounted by component mounting machine 20. Feeder storage 60 is incorporated into production line 10 and stores feeders 30 of a use plan and feeders 30 used up in each component mounting machine 20.

As illustrated in FIG. 3, component mounting machine 20 includes mounting machine main body 21 and feeder 30 that can be attached to and detached from feeder base 40 provided on mounting machine main body 21.

Mounting machine main body 21 includes board conveyance device 22 for conveying board S, mounting head 25 that is fixed (mounted) to slider 24 and takes out components supplied to a component supply position by feeder 30 to mount the same on board S, head moving device 23 that moves mounting head 25 together with slider 24 in the front-rear direction and the left-right direction (XY-directions), and mounting control device 29 (refer to FIG. 7). Board conveyance device 22, head moving device 23, and mounting head 25 are disposed in housing 21a provided on base 21b. Mounting head 25 includes suction nozzle 25a for picking up component, and a lifting and lowering device (not illustrated) for lifting and lowering suction nozzle 25a by a ball screw mechanism, a linear motor, or the like.

In addition, mounting machine main body 21 includes mark camera 26, part camera 28, and the like. Mark camera 26 images a reference mark attached to board S from above in order to detect the position of board S. Part camera 28 images the component that is picked up by suction nozzle 25a from below in order to detect a pickup error or a pickup deviation.

Mounting control device 29 is configured of a well-known CPU, ROM, RAM, and the like. Mounting control device 29 receives image signals from mark camera 26 and part camera 28. In addition, mounting control device 29 outputs drive signals to board conveyance device 22, mounting head 25, head moving device 23, and the like.

As illustrated in FIG. 4, feeder 30 is a rectangular cassette-type tape feeder, and is detachably held by feeder base 40 provided on a front surface of housing 21a of mounting machine main body 21. Feeder 30 includes tape reel 32, tape feeding mechanism 33, connector 35, rail member 37, and supply control device 39 (refer to FIG. 7). Tape 31 is wound on tape reel 32. Tape 31 has cavities formed at predetermined intervals along a longitudinal direction thereof. Each cavity accommodates the component. These components are protected by a film covering a top surface of tape 31. Tape feeding mechanism 33 is a mechanism for drawing tape 31 from tape reel 32 and feeding tape 31 to the component supply position. Although not illustrated, tape feeding mechanism 33 includes a sprocket provided on an outer periphery with engagement claws that engage with a sprocket provided at equal intervals on tape 31, and a feeding motor that rotationally drives the sprocket. Feeder 30 sequentially supplies components accommodated in tape 31 to the component supply position by driving the sprocket by a predetermined rotation amount by a feeding motor to feed tape 31 engaged with the sprocket by a predetermined amount. The component accommodated in tape 31 is in an exposed state at the component supply position by peeling off the film before the component supply position, and is picked up by suction nozzle 25a. Two positioning pins 34 protruding in a mounting direction are provided on both sides of connector 35. Rail member 37 is provided at a lower end of feeder 30 and extends in the mounting direction. Supply control device 39 is configured of a well-known CPU, ROM, RAM, or the like, and outputs a drive signal to tape feeding mechanism 33 (feeding motor). In addition, supply control device 39 can communicate with a control section (for example, mounting control device 29, management device 80, or the like) that is an attachment destination of feeder 30 via connector 35.

Multiple feeders 30 are attached to feeder base 40 so as to be arranged in the X-axis direction. As illustrated in FIG. 5, feeder base 40 is a base having an L-shaped side view and includes slot 42, two positioning holes 44, and connector 45. Rail member 37 of feeder 30 is inserted into slot 42. Two positioning pins 34 of feeder 30 are inserted into two positioning holes 44, and feeder 30 is positioned at feeder base 40. Connector 45 is provided between two positioning holes 44 and is connected to connector 35 of feeder 30.

Respective component mounting machines 20 of first production line 10A and second production line 10B are disposed such that feeder bases 40 of component mounting machines 20 face each other in first production line 10A and second production line 10B. As illustrated in FIG. 1, first loader 50A disposed in first production line 10A and second loader 50B disposed in second production line 10B move along the lines at interval d at which the loaders can pass by each other. By narrowing interval d as much as possible, production system 1 including first production line 10A and second production line 10B can be compactly housed in the factory.

As illustrated in FIG. 2, loader 50 (first loader 50A and second loader 50B) is supported by guide rails 16 provided on the front surface of multiple component mounting machines 20 and the front surface of the feeder storage 60 in parallel with the conveyance direction (the X-axis direction) of the board. Loader 50 is supported by the guide rails 16 in a state of being floated from floor surface F of the factory in which production system 1 is installed. Loader 50 moves along corresponding production line 10 (guide rail 16), thereby replenishing necessary feeders 30 to each component mounting machine 20 or collecting used feeders 30 from each component mounting machine 20.

As illustrated in FIG. 6, loader 50 includes loader moving device 51, feeder transfer device 53, position sensor 57, monitoring sensor 58, and loader control device 59 (refer to FIG. 7). Loader moving device 51 moves loader 50 along guide rail 16. Loader moving device 51 includes motor 52a that drives a driving belt for moving loader 50, and guide roller 52b that rolls on guide rail 16. Feeder transfer device 53 transfers feeder 30 between loader 50, component mounting machine 20, and feeder storage 60. Feeder transfer device 53 includes clamp mechanism 54 for clamping feeder 30, and clamp moving device 55 for reciprocating clamp mechanism 54 in the Y-axis direction (front-rear direction). Position sensor 57 is an encoder that detects a movement position of loader 50 in the left-right direction (X-axis direction).

In the present embodiment, monitoring sensor 58 is configured as a laser scanner having light projecting section 58a and light receiving section 58b as a sensor section. Monitoring sensor 58 detects an obstacle by applying laser light from light projecting section 58a and receiving reflected light from the obstacle by light receiving section 58b.

Figure 8A:
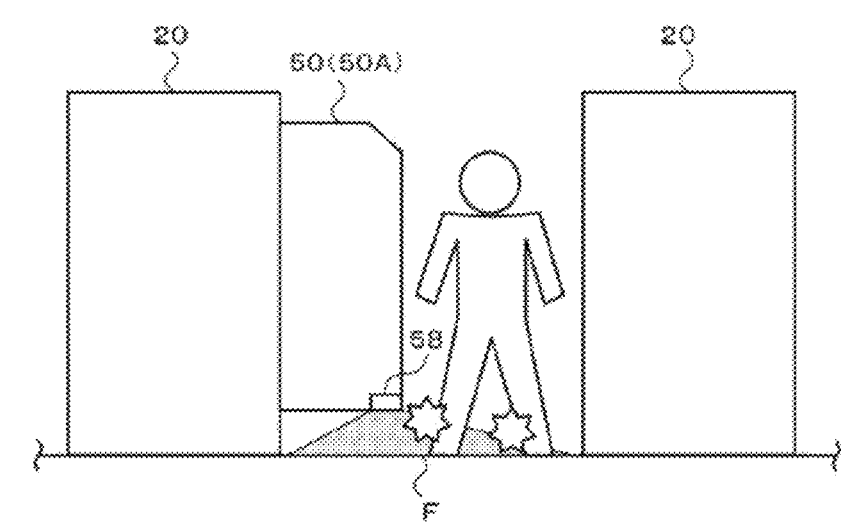
FIG. 8A is an explanatory view illustrating a detection area of a monitoring sensor.
Figure 8B:
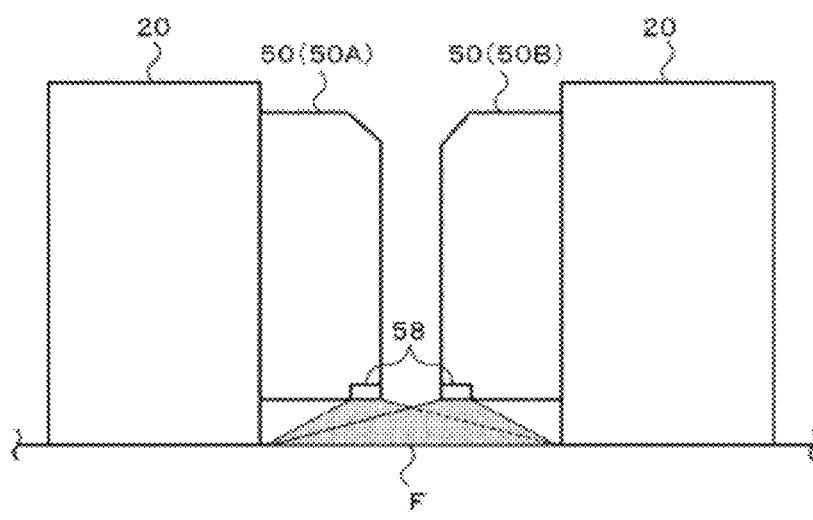
FIG. 8B is an explanatory view illustrating a state of detecting a person body by a monitoring sensor.

In addition, monitoring sensors 58 are disposed at both ends in the conveyance direction of board S so as to make predetermined ranges (ranges filled with gray in FIGS. 1 and 2) in front and side in the advancing direction (left direction and right direction) of loader 50 as detection areas. In addition, monitoring sensor 58 is disposed below loader 50 such that optical axes of light projecting section 58a and light receiving section 58b are oriented obliquely downward. Therefore, monitoring sensor 58 serves as a detection area from floor surface F to a predetermined height, and is configured to be able to detect a foot of the person (operator) mainly as an obstacle. As described above, loader 50 is supported by guide rail 16 in a state of being floated from floor surface F. Therefore, monitoring sensor 58 detects the person (foot) around loader 50 of itself to which monitoring sensor 58 is provided (refer to FIG. 8A), while not detecting loader 50 of the other party when loader 50 of itself passes by loader 50 of the other party (refer to FIG. 8B). That is, monitoring sensor 58 of first loader 50A does not detect second loader 50B as an obstacle when first loader 50A passes by second loader 50B. Similarly, monitoring sensor 58 of second loader 50B does not detect first loader 50A as an obstacle when second loader 50B passes by first loader 50A.

Loader control device 59 is configured by a well-known CPU, ROM, RAM, and the like, receives detection signals from position sensor 57 and monitoring sensor 58, and outputs drive signals to loader moving device 51 and feeder transfer device 53. When exchanging feeder 30, loader control device 59 controls loader moving device 51 so that loader 50 moves at a position facing component mounting machine 20 holding feeder 30 to be exchanged as a target position. When loader 50 arrives at the target position, loader control device 59 controls feeder transfer device 53 so as to clamp used feeder 30 mounted on feeder base 40 of the component mounting machine 20 by clamp mechanism 54 and to pull the feeder in front of loader 50 for collection into loader 50. Then, loader control device 59 controls feeder transfer device 53 so as to clamp new feeder 30 in loader 50 by clamp mechanism 54 and to feed feeder 30 to a rear side to be mounted on feeder base 40 of the component mounting machine 20.

When an obstacle is detected by monitoring sensor 58 during the traveling of loader 50, loader control device 59 controls loader moving device 51 so that the traveling is stopped until the obstacle is not detected. As described above, monitoring sensor 58 does not detect loader 50 of the other party when loader 50 of itself on which monitoring sensor 58 is provided passes by loader 50 of the other party, so that the traveling thereof is not obstructed by loader 50 of the other party.

In feeder storage 60, feeder base 40 having the same configuration as feeder base 40 provided in component mounting machine 20 is provided at the same height as feeder base 40 of component mounting machine 20 in order to accommodate multiple feeders 30. Therefore, loader 50 can attach and detach feeder 30 to and from feeder base 40 of feeder storage 60 in the same operation as attaching and detaching feeder 30 to and from feeder base 40 of component mounting machine 20 at the position facing feeder storage container 60.

AGV 70 replenishes feeder 30 on which components necessary for production are mounted to each feeder storage 60, or collects used feeders 30 from feeder storage 60, while moving between each feeder storage 60 of first production line 10A and second production line 10B, and a warehouse (not illustrated) for storing multiple feeders 30. As illustrated in FIG. 7, AGV 70 includes AGV moving device 71, feeder transfer device 73, position sensor 77, monitoring sensor 78, and AGV control device 79. AGV moving device 71 causes AGV 70 to travel along a predetermined traveling route, and includes a motor and a steering device for traveling. Feeder transfer device 73 transfers feeder 30 to the feeder storage 60 of each production line 10 in the same manner as feeder transfer device 53 of loader 50 described above. Position sensor 77 detects a traveling position of AGV 70. Similar to monitoring sensor 58 of loader 50 described above, monitoring sensor 78 monitors the presence or absence of the obstacle in the advancing direction by, for example, a laser scanner including light projecting section 78a and light receiving section 78b as the sensor section.

AGV control device 79 is configured by a well-known CPU, ROM, RAM, and the like, receives detection signals from position sensor 77 and monitoring sensor 78, and outputs drive signals to AGV moving device 71 (motor) and feeder transfer device 73. AGV control device 79 controls AGV moving device 71 so that AGV 70 moves along a predetermined traveling route to a position facing feeder storage 60 as a target position. When AGV 70 arrives at the target position, AGV control device 79 controls feeder transfer device 73 so as to collect used feeder 30 from feeder base 40 of feeder storage 60 and to mount new feeder 30 on feeder base 40 of the feeder storage 60. When the obstacle is detected by monitoring sensor 78 during the traveling of AGV 70, AGV control device 79 stops the traveling until the obstacle is not detected.

Management device 80 is a general-purpose computer, and as illustrated in FIG. 7, includes CPU 81, ROM 82, HDD 83 (storage device), and RAM 84. Input device 85 such as a keyboard and a mouse, and display 86 are electrically connected to management device 80. In addition to the production schedule, HDD 83 stores feeder holding information, job information, status information, and the like as various information required for production. These information are managed for each production line 10. Here, the production schedule is a schedule that specifies which components are mounted on which board S in which order in each component mounting machine 20, how many boards S (products) mounted in that manner is manufactured, and the like. The feeder holding information is information on feeder 30 held by each component mounting machine 20 and feeder storage 60. The feeder holding information includes, for example, a slot number or a feeder ID of feeder base 40 on which feeder 30 is mounted, a type of a component (component type), a component size, and a remaining number of components included in feeder 30. The job information is information on a mounting instruction to each component mounting machine 20. The job information includes the type of suction nozzle 25a, the type and size of the component to be mounted, the mounting position, and the like. The status information is information indicating the operation status of each component mounting machine 20. The status information includes during the production, during an abnormality occurrence, and the like.

Management device 80 is communicably connected to mounting control device 29 by wire, and exchanges various information with each component mounting machine 20 each production line 10. Management device 80 receives an operation status from each component mounting machine 20 and updates the status information to the latest one. In addition, management device 80 is communicably connected to supply control device 39 of feeder 30 attached to feeder base 40 of each component mounting machine 20 via mounting control device 29. When feeder 30 is removed from component mounting machine 20 or new feeder 30 is attached to component mounting machine 20, management device 80 receives an attachment or detachment status from corresponding component mounting machine 20 and updates the feeder holding information to a latest one. In addition, management device 80 is communicably connected to loader control device 59 wirelessly, and exchanges various information with loader 50. In addition, management device 80 is communicably connected to AGV control device 79 wirelessly, and exchanges various information with AGV 70. In addition to what has been described above, management device 80 is also communicably connected to each control device of printing device 12, print inspection device 14, and the mount inspection device, and also exchanges various information from the corresponding devices.

Figure 9:
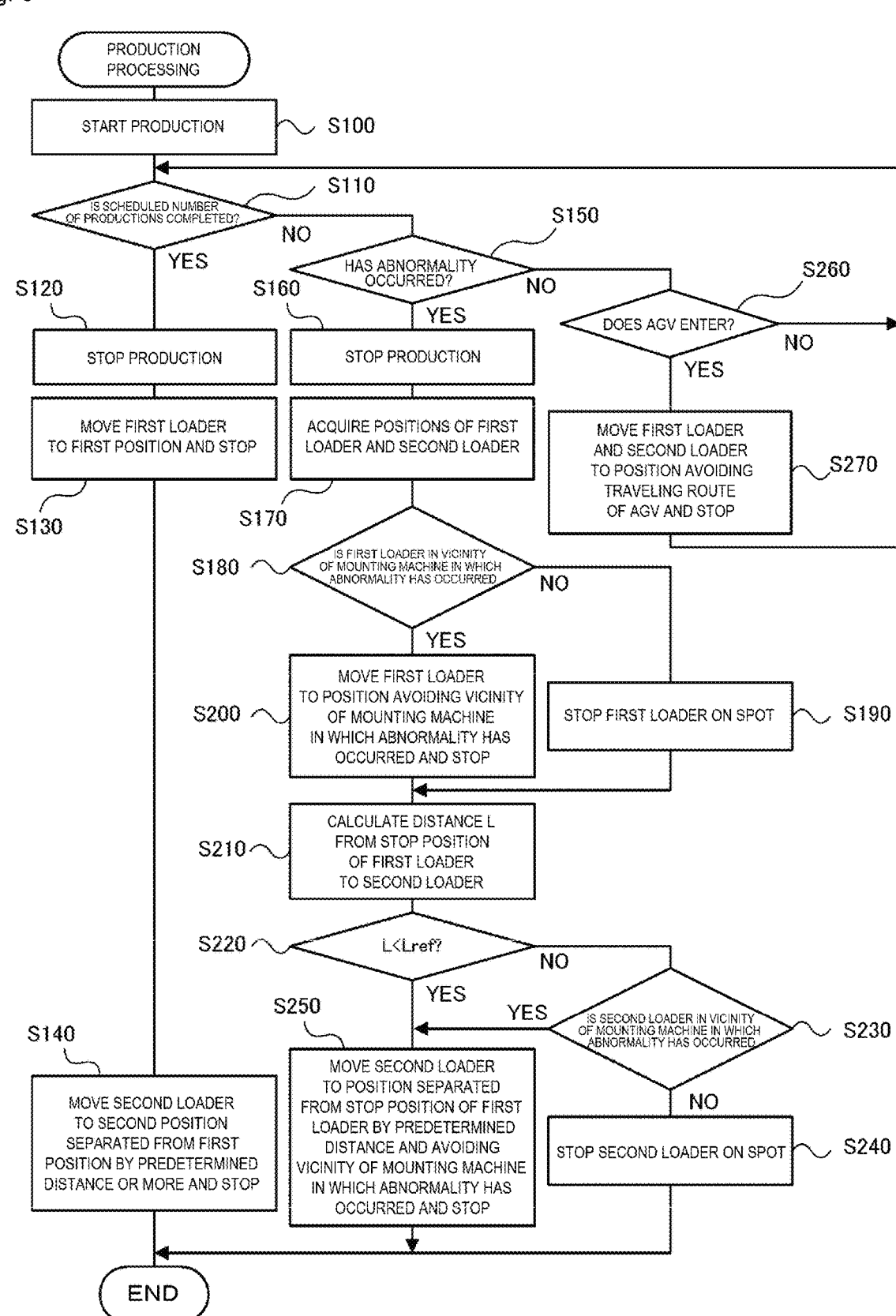
FIG. 9 is a flowchart illustrating an example of production processing.

Next, an operation of production system 1 configured as described above will be described. FIG. 9 is a flowchart illustrating an example of the production processing executed by CPU 81 of management device 80.

When the production processing is executed, CPU 81 of management device 80 first transmits a production command to first production line 10A and second production line 10B so that the production of the product is started in accordance with the production schedule (S100). When the production is started, CPU 81 acquires the production status from each component mounting machine 20, updates the remaining number of components of each feeder 30, and transmits an exchange instruction for instructing the exchange of feeder 30 to corresponding loader 50 when the remaining number of components is small and the component shortage is predicted. When receiving the exchange command, loader 50 moves (travels) to a position facing component mounting machine 20 holding feeder 30 to be exchanged, and exchanges feeder 30.

Figure 10:
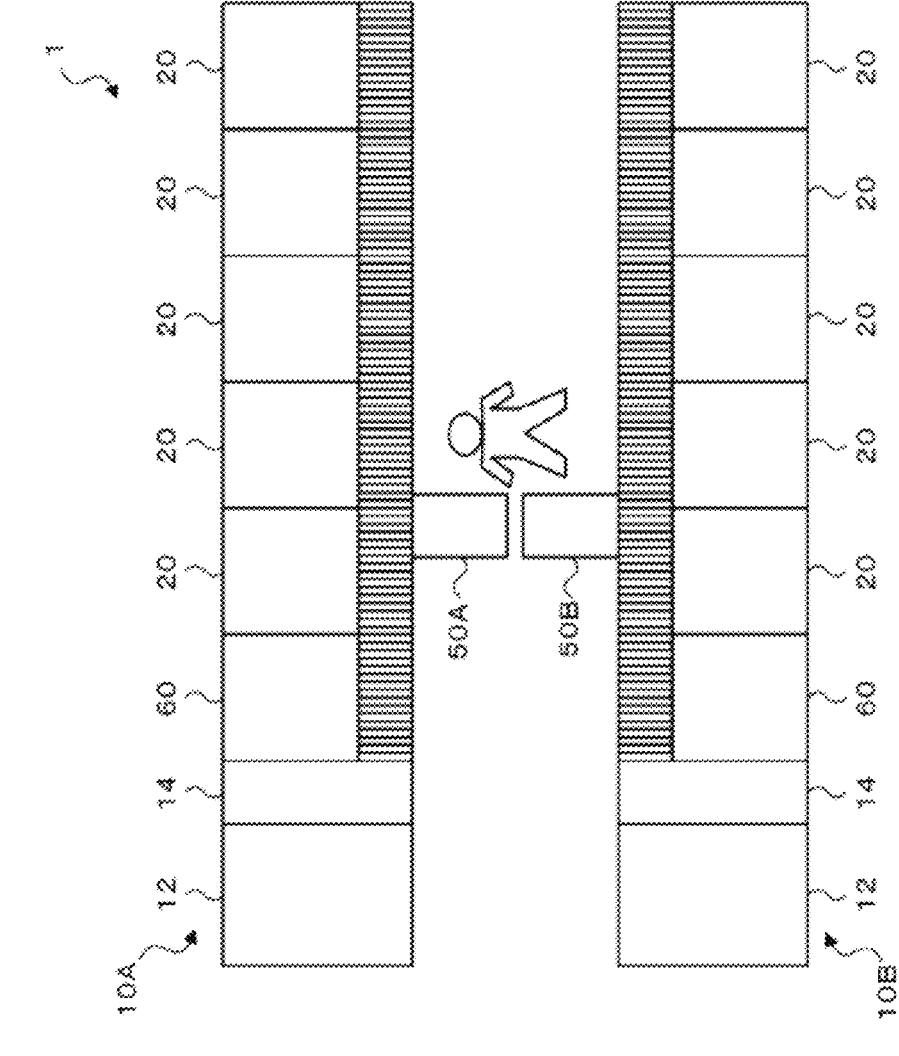
FIG. 10 is an explanatory view illustrating a state where two loaders of a first production line and a second production line close a passage.
Figure 11:
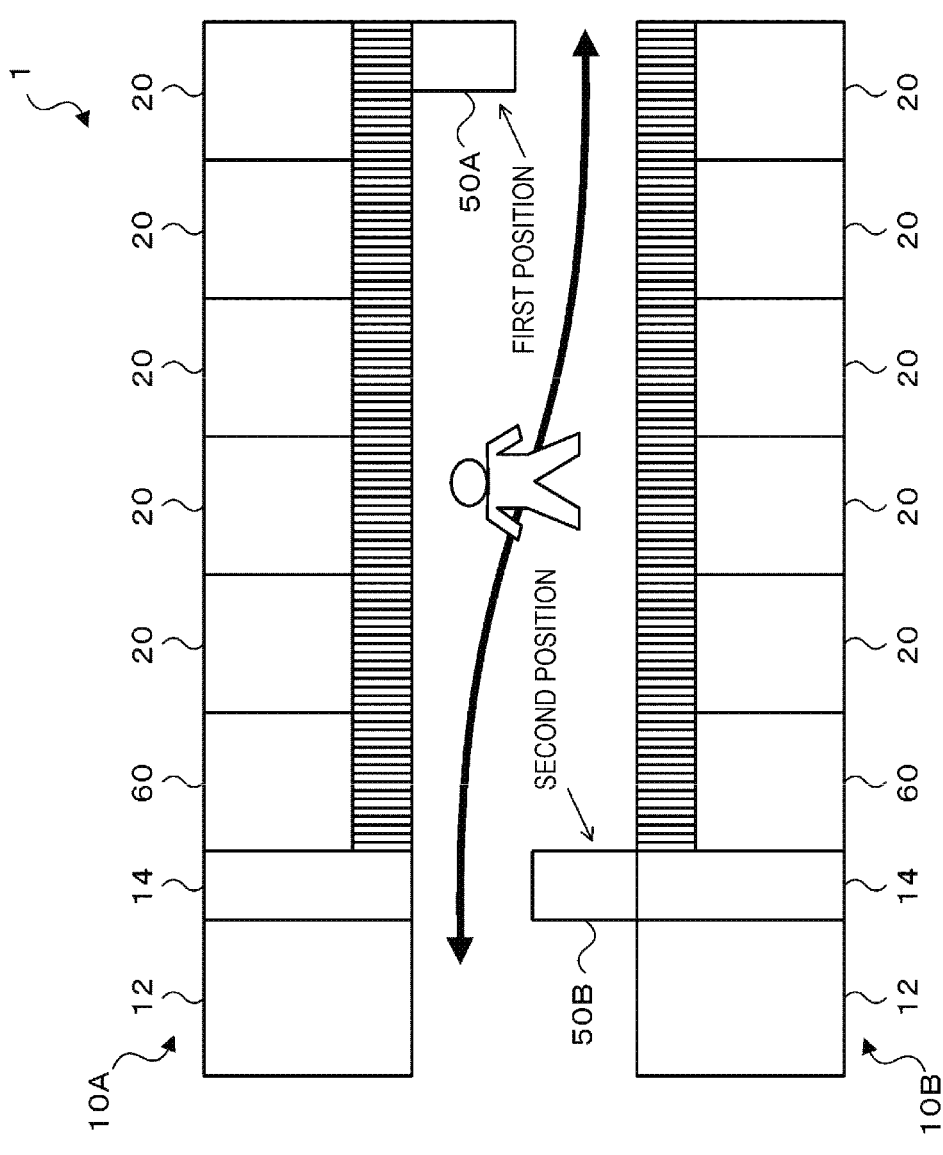
FIG. 11 is an explanatory view illustrating an example of a stop position at which each loader of the first production line and the second production line stops when the scheduled number of productions is completed.

Next, CPU 81 determines whether production of a scheduled number of products has been completed in each of first production line 10A and second production line 10B (S110). When it is determined that the scheduled number of productions is completed, CPU 81 stops the production (S120), moves first loader 50A of first production line 10A to a first position, and then stops first loader 50A (S130). This processing is performed by causing CPU 81 to transmit a stop instruction including a target stop position (first position) to loader control device 59 of first loader 50A, and causing loader control device 59 that has received the stop instruction to control loader moving device 51 to stop first loader 50A at the target stop position. Subsequently, CPU 81 moves second loader 50B of second production line 10B from the first position to a second position that is separated by a predetermined distance (threshold value Lref described later) or more in the direction of the line (board conveyance direction), and then stops second loader 50B (S140), and terminates the production processing. This processing is performed by causing CPU 81 to transmit a stop instruction including a target stop position (second position) to loader control device 59 of second loader 50B, and causing loader control device 59 that has received the stop instruction to control loader moving device 51 to stop second loader 50B at the target stop position. FIG. 10 is an explanatory view illustrating a state where two loaders of the first production line and the second production line close the passage. FIG. 11 is an explanatory view illustrating an example of the stop position at which each loader of the first production line and the second production line stops when the scheduled number of productions is completed. As illustrated in FIG. 10, if interval d, allowing first loader 50A and second loader 50B to pass by each other, is narrow, when the stop positions of first loader 50A and second loader 50B overlap in the direction of the line (board conveyance direction), the passage between the lines is closed by first loader 50A and second loader 50B. In this case, the operator cannot pass through between the lines. On the other hand, in the present embodiment, when the scheduled number of productions in each of first production line 10A and second production line 10B is completed, as illustrated in FIG. 11, first loader 50A and second loader 50B respectively stop at the first position and the second position that are separated by a predetermined distance or more in the direction of the line (board conveyance direction). Therefore, after first production line 10A and second production line 10B are stopped, it is possible to secure the passage through which the operator passes between the lines.

If it is determined in S110 that the scheduled number of productions has not been completed, CPU 81 determines whether an abnormality has occurred in any of component mounting machines 20 in first production line 10A and second production line 10B (S150). This determination is performed by acquiring status information from each component mounting machine 20 in first production line 10A and second production line 10B. When it is determined that an abnormality has occurred in any of component mounting machines 20, CPU 81 stops the production (S160). The stoppage of the production is performed only on the production line including component mounting machine 20 in which the abnormality has occurred among first production line 10A and second production line 10B. CPU 81 acquires the current position of each of first loader 50A and second loader 50B (S170). This processing is performed by acquiring the position detected by each position sensor 57 of first loader 50A and second loader 50B from loader control device 59 by communication. Subsequently, CPU 81 determines whether first loader 50A is located in the vicinity of component mounting machine 20 in which the abnormality has occurred (S180). When it is determined that first loader 50A is not located in the vicinity of component mounting machine 20 in which the abnormality has occurred, CPU 81 causes first loader 50A to stop on the spot (S190). This processing is performed by causing CPU 81 to set the current position of first loader 50A to the target stop position, transmit the stop instruction including the target stop position to loader control device 59 of first loader 50A, and control loader moving device 51 so that loader control device 59 receiving the stop instruction stops first loader 50A at the target stop position. On the other hand, when it is determined that first loader 50A is located in the vicinity of component mounting machine 20 in which the abnormality has occurred, CPU 81 causes first loader 50A to move to a position avoiding the vicinity of component mounting machine 20 in which the abnormality has occurred, and then to stop (S200). This processing is performed by setting a position separated from the position of component mounting machine 20 in which the abnormality has occurred by a predetermined distance to the target stop position, transmitting the stop instruction including the target stop position to loader control device 59 of first loader 50A, and controlling loader moving device 51 so that loader control device 59 receiving the stop instruction stops first loader 50A at the target stop position.

Figure 12:
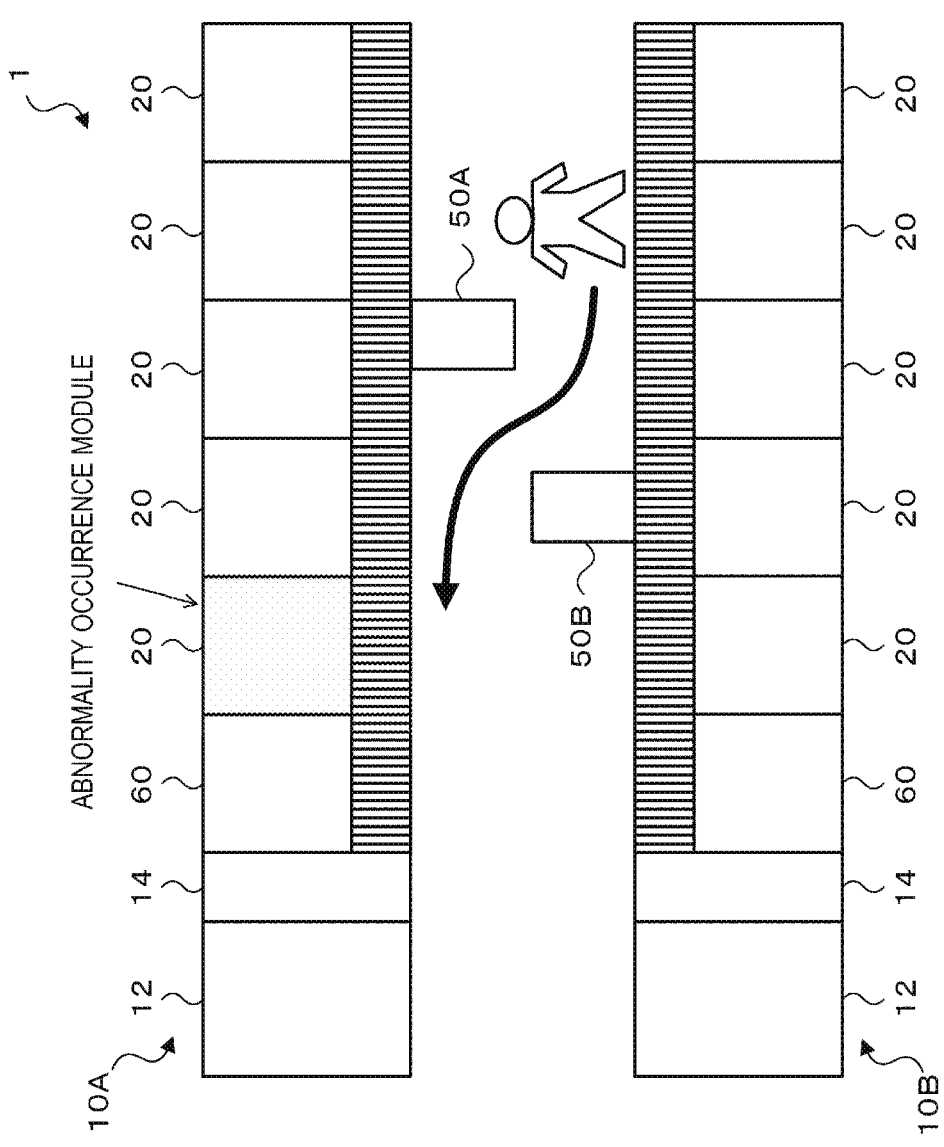
FIG. 12 is an explanatory view illustrating stop positions at which the loaders of the first production line and the second production line stop when an abnormality occurs in any component mounting machine of the production system.

Subsequently, CPU 81 calculates distance L in the direction of the line from the stop position at which first loader 50A is stopped in S190 or S200 to second loader 50B (S210), and determines whether calculated distance L is less than threshold value Lref (S220). Here, threshold value Lref is defined as a minimum gap through which the operator can pass between first loader 50A and second loader 50B. When it is determined that distance L is threshold value Lref or more, CPU 81 further determines whether second loader 50B is located in the vicinity of component mounting machine 20 in which the abnormality has occurred (S230). when it is determined that second loader 50B is not located in the vicinity of component mounting machine 20 in which the abnormality has occurred, CPU 81 stops second loader 50B on the spot (S240), and terminates the production processing. This processing is performed by causing CPU 81 to set the current position of second loader 50B to the target stop position, transmit the stop instruction including the target stop position to loader control device 59 of second loader 50B, and control loader moving device 51 so that loader control device 59 receiving the stop instruction stops second loader 50B at the target stop position. If it is determined in S200 that distance L is less than threshold value Lref, or if it is determined in S210 that second loader 50B is located in the vicinity of the component mounting machine 20 in which the abnormality has occurred even if distance L is threshold value Lref or more, CPU 81 causes second loader 50B to move to a position separated from the stop position of first loader 50A by threshold value Lref or more and avoiding the vicinity of component mounting machine 20 in which the abnormality has occurred, and then to stop (S250), and terminates the production processing. This processing is performed by setting the target stop position based on the stop position of first loader 50A and the position of component mounting machine 20 in which the abnormality has occurred, transmitting the stop instruction including the target stop position to loader control device 59 of second loader 50B, and controlling loader moving device 51 so that loader control device 59 receiving the stop instruction stops second loader 50B at the target stop position. FIG. 12 is an explanatory view illustrating the stop position at which each loader of the first production line and the second production line stops when the abnormality occurs in any component mounting machine of the production system. When the abnormality occurs in component mounting machine 20 in any one of first production line 10A and second production line 10B, as illustrated in FIG. 12, first loader 50A and second loader 50B are separated from each other in the direction of the line by threshold value Lref or more, and in addition, stop at positions avoiding the vicinity of component mounting machine 20 in which the abnormality has occurred. Therefore, the operator can go to the front of the component mounting machine 20 in which the abnormality has occurred through the lines, confirm the state of the component mounting machine 20, and perform necessary works.

Figure 13:
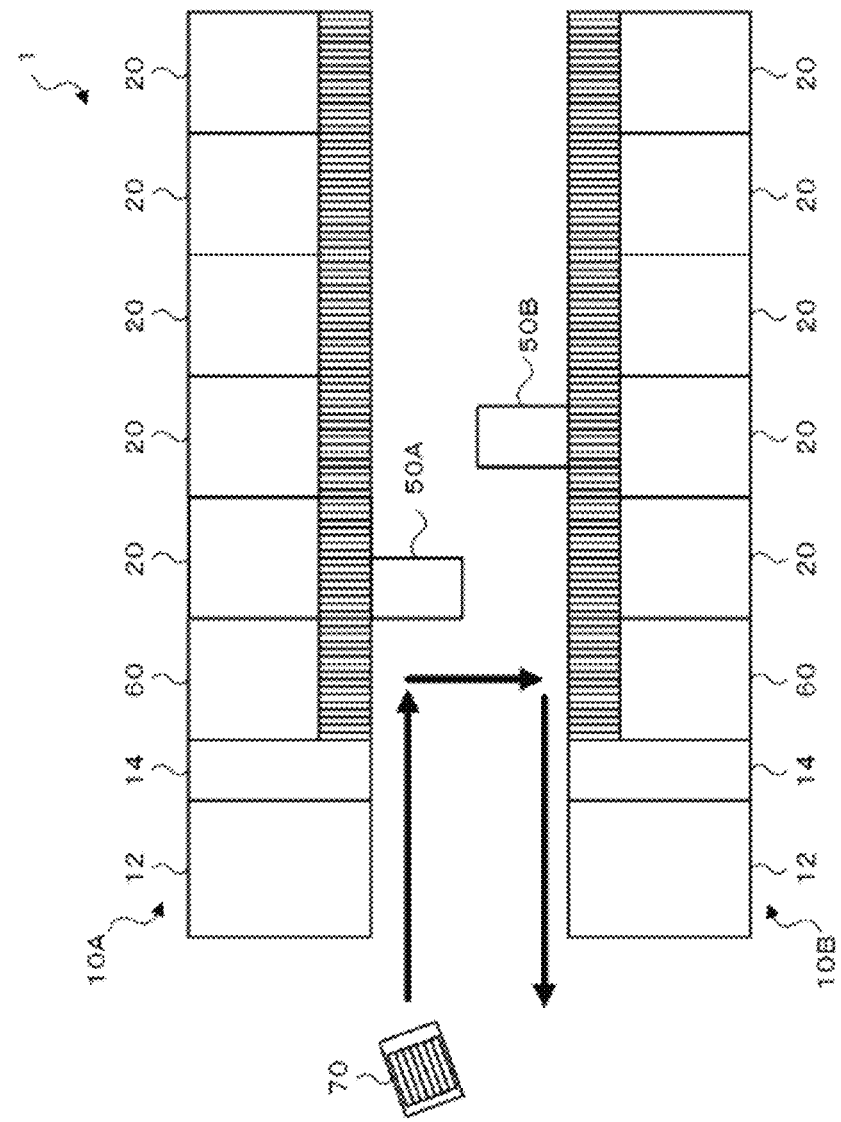
FIG. 13 is an explanatory view illustrating an example of a stop position at which each loader of the first production line and the second production line stops when an AGV enters.

If it is determined in S140 that no abnormality has occurred in any of component mounting machines 20, CPU 81 further determines whether AGV 70 enters between the lines of first production line 10A and second production line 10B (S260). This processing can be determined based on the production schedule or based on a predetermined running time of AGV 70. When it is determined that AGV 70 enters, CPU 81 causes first loader 50A and second loader 50B to move to positions avoiding the traveling route of AGV 70, and then to stop (S270), and returns to S110. This processing is performed by setting the target stop position by CPU 81 based on the traveling route of AGV 70, transmitting the stop instruction including the target stop position to each loader control device 59 of first loader 50A and second loader 50B, and controlling loader moving device 51 so that loader control device 59 receiving the stop instruction stops corresponding loader 50 at the target stop position. FIG. 13 is an explanatory view illustrating an example of the stop position at which each loader of the first production line and the second production line stops when the AGV enters. As illustrated in the drawing, when AGV 70 enters between the lines, first loader 50A and second loader 50B stop at a position where the traveling route of AGV 70 (refer to thick-line arrows in FIG. 13) is not closed. Therefore, AGV 70 can smoothly collect and replenish feeders 30 necessary for each feeder storage 60 of first production line 10A and second production line 10B. CPU 81 restarts the traveling of first loader 50A and second loader 50B when the collection and replenishment of feeder 30 by AGV 70 are completed and feeder 30 exits the production line 10.

Here, a correspondence between the elements of the first embodiment and elements described in claims will be described. That is, first production line 10A of the first embodiment corresponds to the first production line, second production line 10B corresponds to the second production line, feeder base 40 corresponds to the attachable and detachable section, first loader 50A corresponds to the first feeder exchange device, and second loader 50B corresponds to the second feeder exchange device of the present disclosure. In addition, AGV 70 corresponds to an automatic conveyance device.

It goes without saying that the present disclosure is not limited to the above-described embodiments, and may be implemented in various aspects as long as it belongs to the technical scope of the present disclosure.

Figure 14:
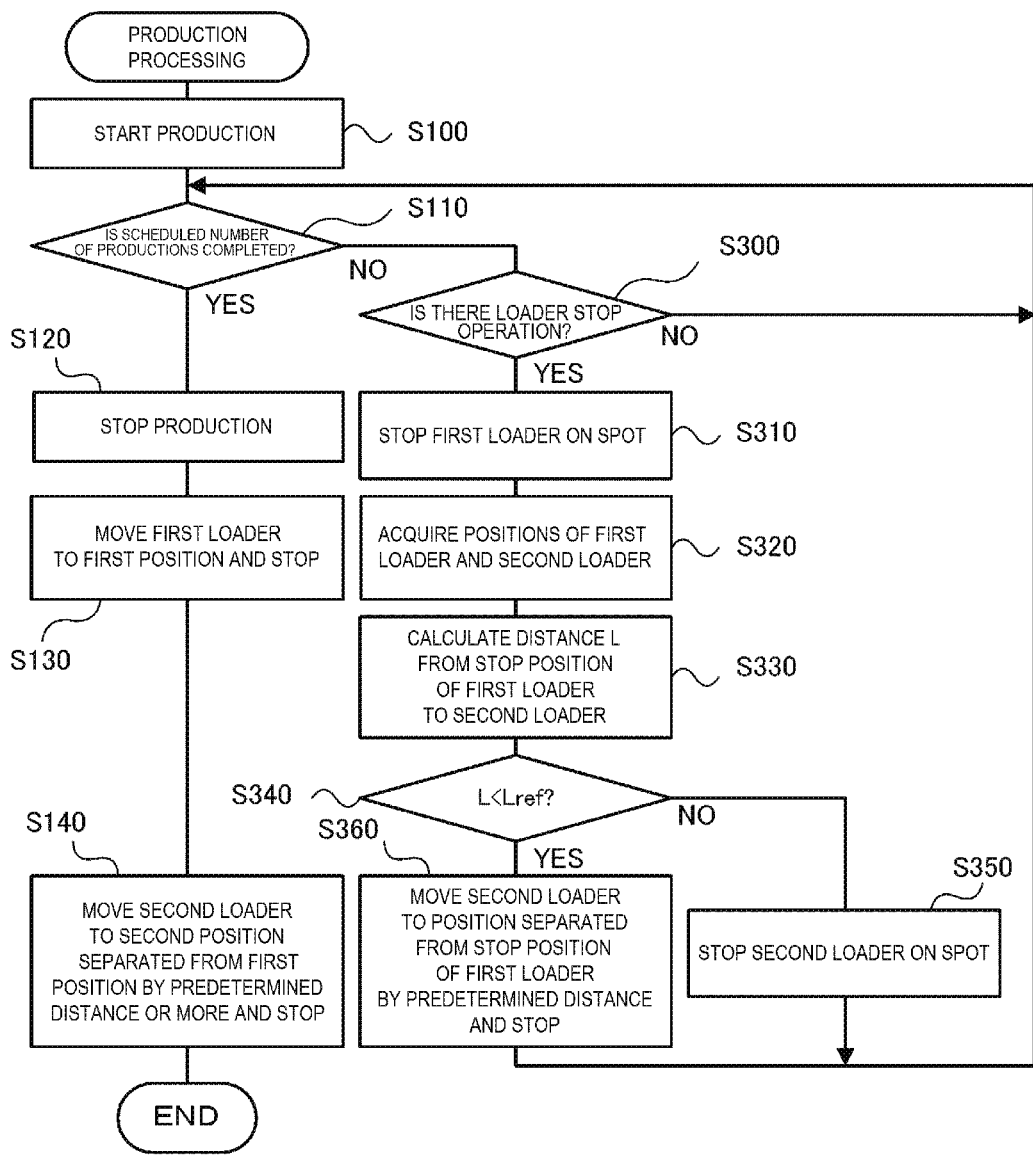
FIG. 14 is a flowchart illustrating production processing according to a modification example.

For example, in the first embodiment, first loader 50A and second loader 50B are stopped at positions separated from each other by a predetermined distance or more in the direction of the line when the abnormality occurs in any of the component mounting machines 20. However, first loader 50A and second loader 50B may be alternatively or additionally stopped at positions separated from each other by a predetermined distance or more in the direction of the line when a predetermined operation is performed. FIG. 14 is a flowchart illustrating production processing according to a modification example. In the process of FIG. 14, the same process as that of FIG. 9 is assigned with the same step numeral, and description thereof will be omitted. In the production processing of the modification example, if it is determined in S110 that the scheduled number of productions is not completed, CPU 81 of management device 80 determines whether a stop request operation requesting the stop of loaders 50 is made by the operator (S300). This processing is performed, for example, by determining whether the stop request operation is performed by input device 85. When it is determined that the stop request operation has not been performed, CPU 81 returns to S110. On the other hand, when it is determined that the stop request operation has been performed, CPU 81 causes first loader 50A to stop on the spot (S310), and acquires the current positions of first loader 50A and second loader 50B (S320). Subsequently, CPU 81 calculates distance L from the stop position of first loader 50A to second loader 50B (S320), and determines whether calculated distance L is less than threshold value Lref (S340). When it is determined that distance L is threshold value Lref or more, CPU 81 stops second loader 50B on the spot (S350), and returns to S110. On the other hand, when it is determined that distance L is less than threshold value Lref, CPU 81 causes second loader 50B to move to a position separated from the stop position of first loader 50A in the direction of the line by threshold value Lref or more, and then to stop (S360), and returns to S110. The control of first loader 50A and the stop control of second loader 50B have been described above. Therefore, the operator can stop first loader 50A and second loader 50B at any timings while securing the passage between the lines.

In the first embodiment, first loader 50A and second loader 50B are stopped at positions separated from each other by a predetermined distance or more in the direction of the line when AGV 70 enters between the lines. However, first loader 50A and second loader 50B may be stopped at positions separated from each other by a distance specified in advance or more in the direction of the line during a predetermined time zone regardless of the entrance of AGV 70. Therefore, the operator can perform necessary work between the lines in a specified time zone.

In the first embodiment, when stopping first loader 50A and second loader 50B, management device 80 (CPU 81) sets the target stop position so as to acquire the current positions from both loaders 50A and 50B, and stop both loaders 50A and 50B at positions separated from each other by a predetermined distance or more, and transmits the stop instruction including the target stop position to loader control device 59 of both loaders 50A and 50B. However, loader control device 59 of both loaders 50A and 50B may set and control the target stop position by itself so that both loaders 50A and 50B are stopped at positions separated from each other by a predetermined distance or more by communicating with each other to grasp the current position of the loader of the other party.

Figure 15:
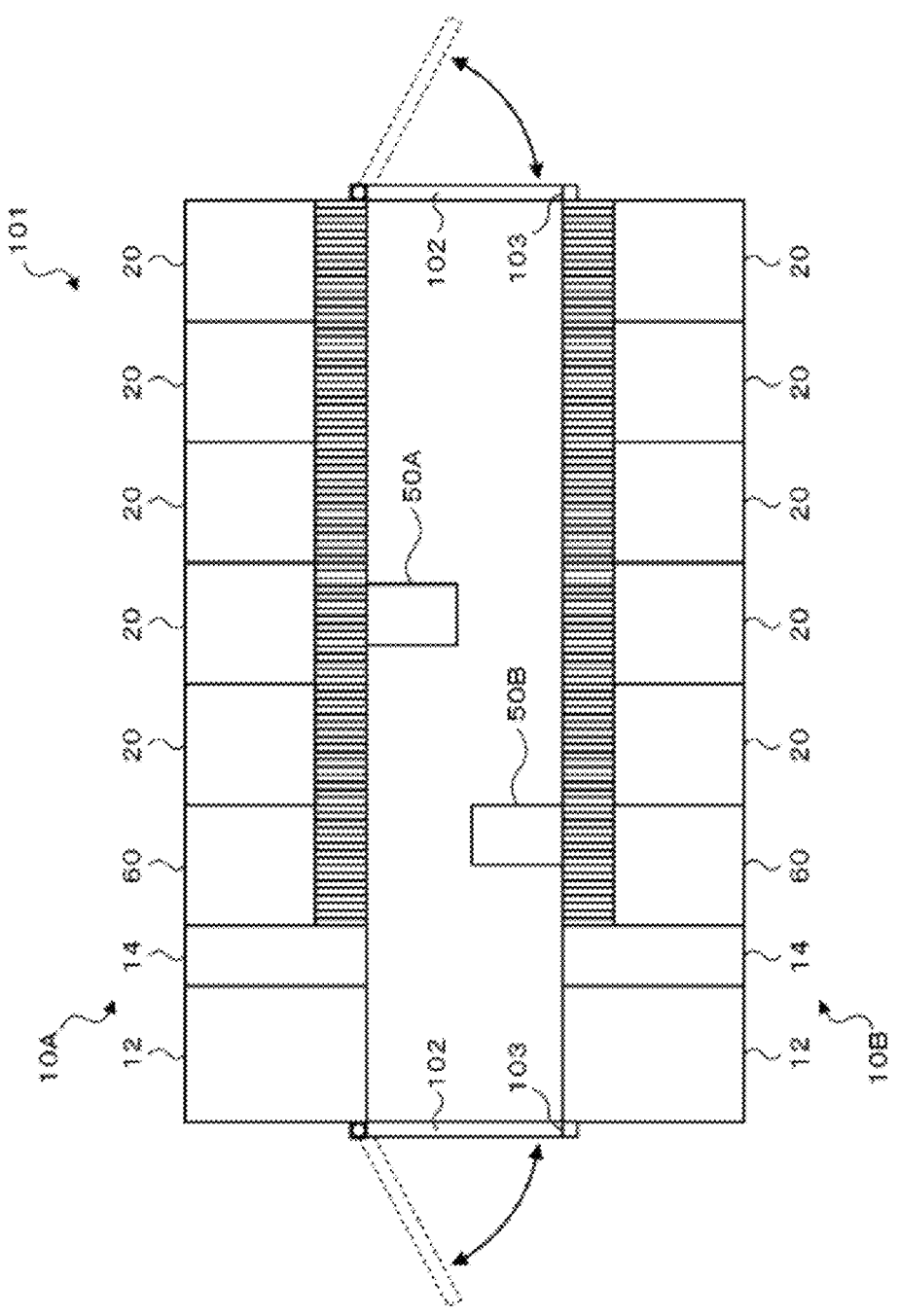
FIG. 15 is a schematic configuration view of a production system according to a second embodiment.
Figure 16:
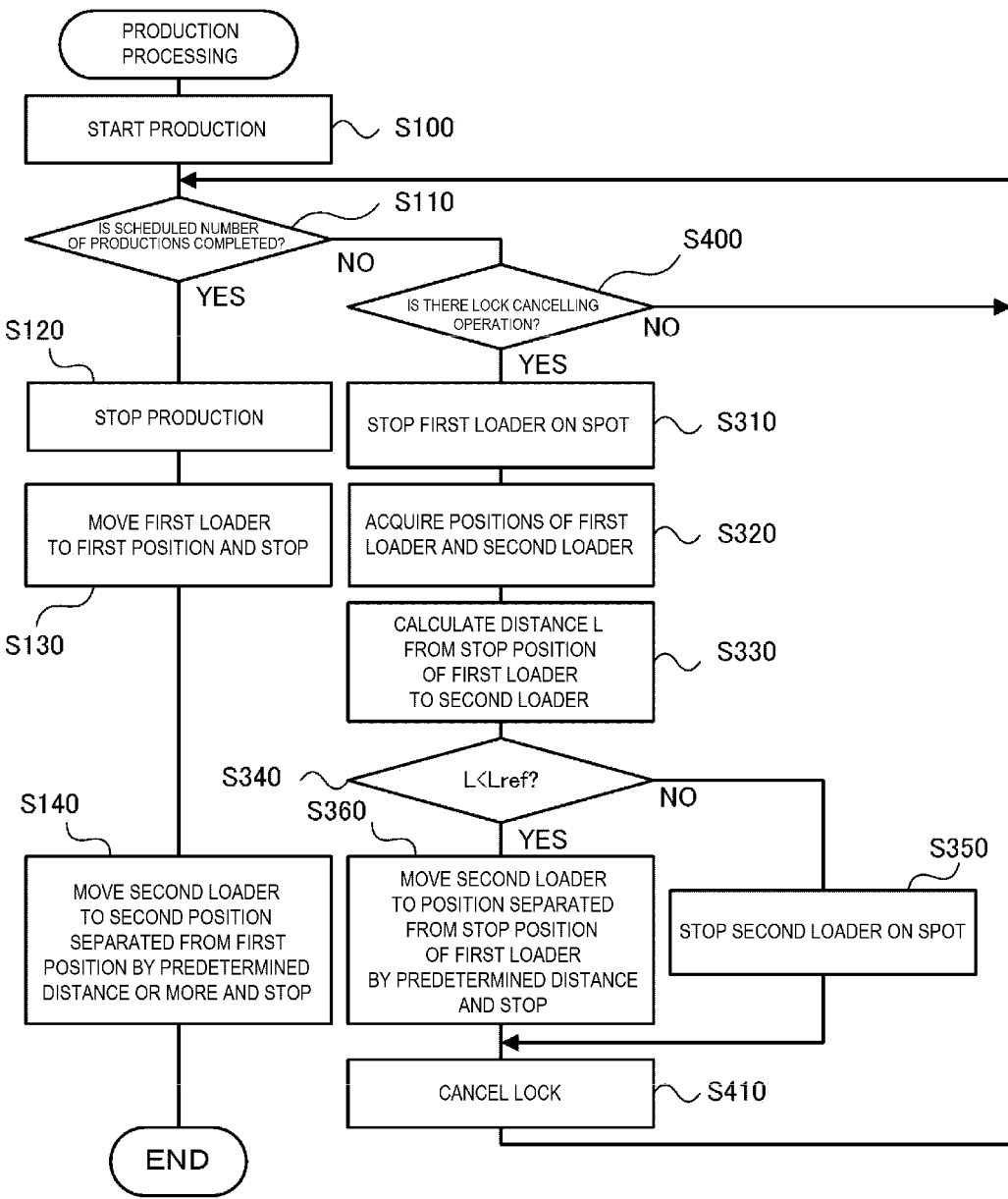
FIG. 16 is a flowchart illustrating production processing according to the second embodiment.

FIG. 15 is a schematic configuration view of a production system according to a second embodiment. Production system 101 according to the second embodiment includes openable/closable fences 102 respectively provided at both ends of first production line 10A and second production line 10B for preventing the person from intruding between the lines, and lock device 103 for locking fence 102 in a closed state. Lock device 103 is controlled by CPU 81 of management device 80. FIG. 16 is a flowchart illustrating production processing according to the second embodiment. Here, the production processing in FIG. 16 differs from the production processing in FIG. 14 in that S400 is executed instead of S300 and the processing in S410 is executed after S350 and S360. In the second embodiment, if it is determined in S110 that the scheduled number of productions is not completed, CPU 81 of management device 80 determines whether a request for cancelling of lock of fence 102 is made (S400). When it is determined that the request for cancelling of lock has not been made, CPU 81 returns to S110. On the other hand, when it is determined that the request for cancelling of lock has been made, CPU 81 causes first loader 50A and second loader 50B to stop at positions separated from each other by a predetermined distance (threshold value Lref) or more, similarly to steps S310 to S360 of the production processing in FIG. 14. Then, CPU 81 controls lock device 103 so that lock of fence 102 is canceled (S410), and returns to S110. Therefore, in production system 101 of the second embodiment, it is possible to prevent a person from intruding between the lines by locking fence 102 in the closed state by lock device 103 at a normal time. In addition, when there is a request for cancelling of lock, production system 101 can secure the passage through which the person can pass between the lines by cancelling the lock of fence 102 after stopping first loader 50A and second loader 50B at positions separated from each other by a predetermined distance or more. When the person exits from between the lines, fence 102 is closed, and the lock is requested, CPU 81 controls lock device 103 so that fence 102 is locked, and then restarts the traveling of first loader 50A and second loader 50B. In the second embodiment, first loader 50A and second loader 50B may not include monitoring sensor 58.

Figure 17:
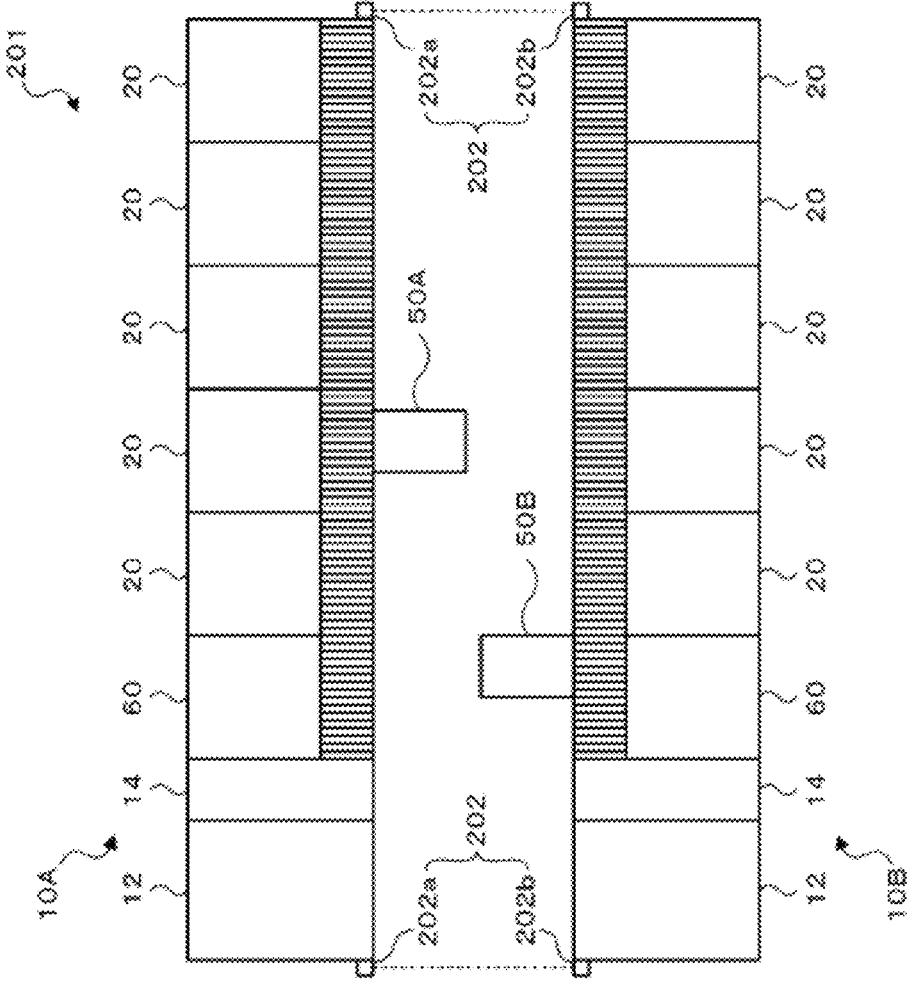
FIG. 17 is a schematic configuration view of a production system according to a third embodiment.

FIG. 17 is a schematic configuration view of a production system according to a third embodiment. As illustrated in the drawing, production system 201 of the third embodiment includes intrusion detecting sensors 202 for detecting the intrusion of the person (operator) between lines at both ends of first production line 10A and second production line 10B. Intrusion detecting sensor 202 is configured as, for example, a transmissive optical sensor including light emitting section 202a provided at an end portion of one production line of

13

Figure 18:
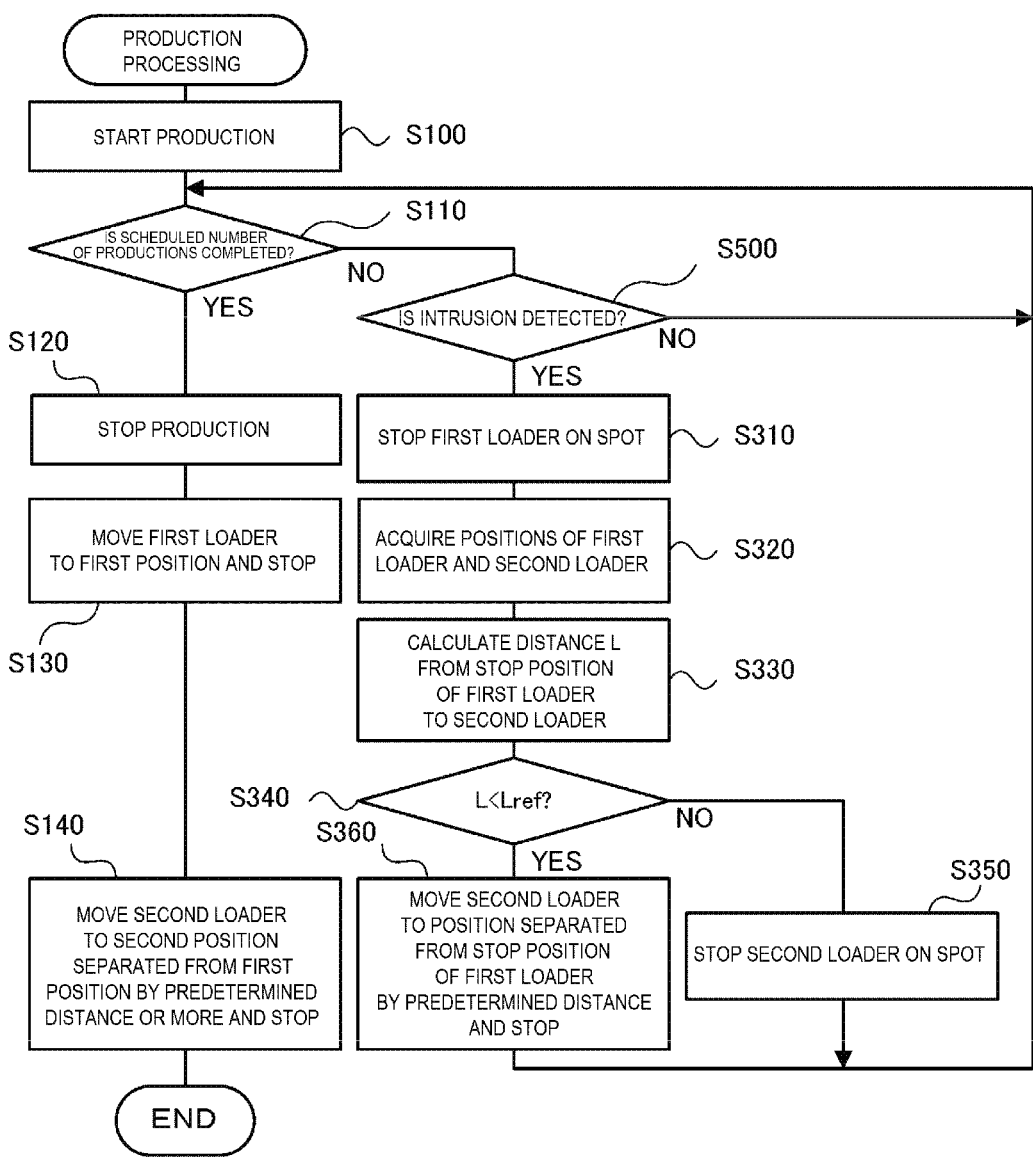
FIG. 18 is a flowchart illustrating production processing according to the third embodiment.

14 first production line 10A and second production line 10B, and light receiving section 202b provided at an end portion of the other production line so as to face light emitting section 202a. A detection signal from intrusion detecting sensor 202 is inputted to management device 80 of production system 201. FIG. 18 is a flowchart illustrating production processing according to the third embodiment. Here, the production processing in FIG. 18 differs from the production processing in FIG. 14 in that S500 is executed instead of S300. In the third embodiment, if it is determined in S110 that the scheduled number of productions is not completed, CPU 81 of management device 80 determines whether the intrusion of the person is detected by intrusion detecting sensor 202 (S500). When it is determined that the intrusion of the person has not been detected, CPU 81 returns to step S110. On the other hand, when it is determined that the intrusion of the person has been detected, CPU 81 causes first loader 50A and second loader 50B to stop at positions separated from each other by a predetermined distance (threshold value Lref) or more, similarly to steps S310 to S360 of the production processing in FIG. 14, and returns to step S110. Therefore, it is possible to secure the passage through which the person can pass between the lines. After intrusion detecting sensor 202 detects the intrusion of the person between the lines, CPU 81 restarts the traveling of first loader 50A and second loader 50B when intrusion detecting sensor 202 detects the exit of the person from between the lines.

As described above, the production system of the present disclosure includes a first production line including multiple component mounting machines that are arranged in a board conveyance direction, are provided with attachable and detachable sections to and from which feeders are attached and detached, and mount components supplied from the feeders mounted on the attachable and detachable sections on a board; a second production line including multiple component mounting machines that are arranged in parallel with the first production line, are provided with attachable and detachable sections so as to face the attachable and detachable sections of the first production line, and mount components supplied from feeders mounted on the attachable and detachable sections on the board; a first feeder exchange device configured to move in an alignment direction of each component mounting machine of the first production line and exchange the feeder by attaching and detaching the feeder to and from the attachable and detachable section of each component mounting machine of the first production line; and a second feeder exchange device configured to move in an alignment direction of each component mounting machine of the second production line at an interval that allows the second feeder exchange device to pass by the first feeder exchange device and exchange the feeder by attaching and detaching the feeder to and from the attachable and detachable section of each component mounting machine of the second production line, in which when a production is stopped, the first feeder exchange device and the second feeder exchange device are stopped at an interval of a predetermined distance or more from each other in the board conveyance direction.

A production system of the present disclosure includes a first production line and a second production line arranged in parallel with each other, and a first feeder exchange device and a second feeder exchange device respectively provided in each production line at an interval with which the first feeder exchange device and the second feeder exchange device can pass by each other. When the production is stopped, the first feeder exchange device and the second feeder exchange device are stopped at intervals of a predetermined distance or more from each other in the board conveyance direction (extending direction of the production line). Therefore, even if the interval between the production lines is narrowed, it is possible to provide a production system capable of securing a space through which a person can pass between the production lines when the production is stopped.

In such a production system of the present disclosure, when the production is stopped by completing the scheduled number of productions, the first feeder exchange device and the second feeder exchange device may respectively move to predetermined stop positions and stop, and the stop position of the first feeder exchange device and the stop position of the second feeder exchange device may be determined at positions separated from each other by the predetermined distance or more in the board conveyance direction. Accordingly, it is possible to secure the passage for the person to pass between the lines after the production line is stopped.

In the production system of the present disclosure, when the production is stopped by an occurrence of a predetermined abnormality, the first feeder exchange device and the second feeder exchange device may stop when they are separated from each other by the predetermined distance or more in the board conveyance direction, and may move to positions separated from each other by the predetermined distance or more, and then stop when they are not separated from each other by the predetermined distance or more in the board conveyance direction. Accordingly, when the abnormality occurs, each feeder exchange device can be stopped at an early stage while securing the passage through which the operator passes between the lines.

In this case, when the production is stopped by the abnormality occurring in any of the component mounting machines constituting the first production line and the second production line, the first feeder exchange device and the second feeder exchange device may be separated from each other by the predetermined distance or more in the board conveyance direction, and stop at positions avoiding the vicinity of the component mounting machine in which the abnormality has occurred. Accordingly, when the abnormality occurs in any of the component mounting machines, it is possible to secure a work space where the operator can go to the component mounting machine to confirm the abnormality or perform necessary works.

In the production system of the present disclosure, when a stop instruction is issued by a predetermined operation, the first feeder exchange device and the second feeder exchange device may stop at the interval of the predetermined distance or more from each other in the board conveyance direction. Accordingly, the operator can stop the first feeder exchange device and the second feeder exchange device at any timings while securing the passage between the lines.

Further, in the production system of the present disclosure, an automatic conveyance device configured to load and unload feeders into and from the first production line and the second production line in a predetermined traveling route in a predetermined time zone or schedule may be provided, and the first feeder exchange device and the second feeder exchange device may stop at positions avoiding the traveling route at a timing when the automatic conveyance device loads and unloads the feeders into and from the first production line and the second production line. Accordingly, it is possible to smoothly collect and replenish the feeder by the automatic conveyance device.

The second production system of the present disclosure includes a first production line including multiple component mounting machines that are arranged in a board conveyance direction, are provided with attachable and detachable sections to and from which feeders are attached and detached, and mount components supplied from the feeders mounted on the attachable and detachable sections on a board; a second production line including multiple component mounting machines that are arranged in parallel with the first production line, are provided with attachable and detachable sections so as to face the attachable and detachable sections of the first production line, and mount components supplied from feeders mounted on the attachable and detachable sections on the board; a first feeder exchange device configured to move in an alignment direction of each component mounting machine of the first production line and exchange the feeder by attaching and detaching the feeder to and from the attachable and detachable section of each component mounting machine of the first production line; a second feeder exchange device configured to move in an alignment direction of each component mounting machine of the second production line at an interval that allows the second feeder exchange device to pass by the first feeder exchange device and exchange the feeder by attaching and detaching the feeder to and from the attachable and detachable section of each component mounting machine of the second production line; a fence configured to be opened and closed for preventing a person from intruding into a region which is surrounded by the first production line and the second production line; and a lock device configured to lock the fence in a closed state, in which when cancelling of lock of the lock device is required, the first feeder exchange device and the second feeder exchange device are stopped at an interval of a predetermined distance or more from each other in the board conveyance direction, and when cancelling of lock is required, the lock device cancels the lock after the first feeder exchange device and the second feeder exchange device stop.

A third production system according to the present disclosure includes a first production line including multiple component mounting machines that are arranged in a board conveyance direction, are provided with attachable and detachable sections to and from which feeders are attached and detached, and mount components supplied from the feeders mounted on the attachable and detachable sections on a board; a second production line including multiple component mounting machines that are arranged in parallel with the first production line, are provided with attachable and detachable sections so as to face the attachable and detachable sections of the first production line, and mount components supplied from feeders mounted on the attachable and detachable sections on the board; a first feeder exchange device configured to move in an alignment direction of each component mounting machine of the first production line and exchange the feeder by attaching and detaching the feeder to and from the attachable and detachable section of each component mounting machine of the first production line; a second feeder exchange device configured to move in an alignment direction of each component mounting machine of the second production line at an interval that allows the second feeder exchange device to pass by the first feeder exchange device and exchange the feeder by attaching and detaching the feeder to and from the attachable and detachable section of each component mounting machine of the second production line; and an intrusion detecting sensor configured to detect intrusion of a person into a region which is surrounded by the first production line and the second production line, in which when the intrusion of the person is detected by the intrusion detecting sensor, the first feeder exchange device and the second feeder exchange device stop at an interval of a predetermined distance or more from each other in the board conveyance direction.

INDUSTRIAL APPLICABILITY

The present disclosure can be applied to a manufacturing industry of a production system or the like.

REFERENCE SIGNS LIST 1, 101, 201 production system, 10 production line, 10A first production line, 10B second production line, 12 printing device, 14 print inspection device, 16 guide rails, 20 component mounting machine, 21 mounting machine main body, 21a housing, 21b base, 22 board conveyance device, 23 head moving device, 24 slider, 25 mounting head, 25a suction nozzle, 26 mark camera, 28 part camera, 29 mounting control device, 30 feeder, 31 tape, 32 tape reel, 33 tape feeding mechanism, 34 positioning pin, 35 connector, 37 rail member, 39 supply control device, 40 feeder base, 42 slot, 44 positioning hole, 45 connector, 50 loader, 50A first loader, 50B second loader, 51 loader moving device, 52a motor, 52b guide roller, 53 feeder transfer device, 54 clamp mechanism, 55 clamp moving device, 57 position sensor, 58 monitoring sensor, 58a light projecting section, 58b light receiving section, 59 loader control device, 60 feeder storage, 70 AGV, 71 AGV moving device, 73 feeder transfer device, 77 position sensor, 78 monitoring sensor, 78a light projecting section, 78b light receiving section, 79 AGV control device, 80 management device, 81 CPU, 82 ROM, 83 HDD, 84 RAM, 85 input device, 86 display, 102 fence, 103 lock device, 202 intrusion detecting sensor, 202a light emitting section, 202b light receiving section, S board

The invention claimed is:
1. A production system comprising:
a first production line including multiple component mounting machines that are arranged in a board conveyance direction, are provided with attachable and detachable sections to and from which feeders are attached and detached, and mount components supplied from the feeders mounted on the attachable and detachable sections on a board;
a second production line including multiple component mounting machines that are arranged in parallel with the first production line, are provided with attachable and detachable sections so as to face the attachable and detachable sections of the first production line, and mount components supplied from feeders mounted on the attachable and detachable sections on the board;
a first feeder exchange device configured to move in an alignment direction of each component mounting machine of the first production line and exchange a feeder by attaching and detaching the feeder to and from the attachable and detachable section of each component mounting machine of the first production line; and
a second feeder exchange device configured to move in an alignment direction of each component mounting machine of the second production line at an interval that allows the second feeder exchange device to pass by the first feeder exchange device and exchange a feeder by attaching and detaching the feeder to and from the attachable and detachable section of each component mounting machine of the second production line, wherein when a production is stopped, the first feeder exchange device and the second feeder exchange device are stopped at an interval of a predetermined distance or more from each other in the board conveyance direction.

2. The production system according to claim 1, wherein when the production is stopped by completing a scheduled number of productions, the first feeder exchange device and the second feeder exchange device respectively move to predetermined stop positions and stop, and the stop position of the first feeder exchange device and the stop position of the second feeder exchange device are determined at positions separated from each other by the predetermined distance or more in the board conveyance direction.

3. The production system according to claim 1, wherein when the production is stopped by an occurrence of a predetermined abnormality, the first feeder exchange device and the second feeder exchange device stop when the first feeder exchange device and the second feeder exchange device are separated from each other by the predetermined distance or more in the board conveyance direction, and move to positions separated from each other by the predetermined distance or more and then stop when the first feeder exchange device and the second feeder exchange device are not separated from each other by the predetermined distance or more in the board conveyance direction.

4. The production system according to claim 3, wherein when the production is stopped by an abnormality occurring in any of the component mounting machines constituting the first production line and the second production line, the first feeder exchange device and the second feeder exchange device are separated from each other by the predetermined distance or more in the board conveyance direction, and stop at positions avoiding a vicinity of the component mounting machine in which the abnormality has occurred.

5. The production system according to claim 1, wherein when a stop instruction is issued by a predetermined operation, the first feeder exchange device and the second feeder exchange device stop at the interval of the predetermined distance or more from each other in the board conveyance direction.

6. The production system according to claim 1, further comprising:

an automatic conveyance device configured to load and unload feeders into and from the first production line and the second production line in a predetermined traveling route in a predetermined time zone or schedule, wherein the first feeder exchange device and the second feeder exchange device stop at positions avoiding the traveling route at a timing when the automatic conveyance device loads and unloads the feeders into and from the first production line and the second production line.

7. A production system comprising:

a first production line including multiple component mounting machines that are arranged in a board conveyance direction, are provided with attachable and detachable sections to and from which feeders are attached and detached, and mount components supplied from the feeders mounted on the attachable and detachable sections on a board;

a second production line including multiple component mounting machines that are arranged in parallel with the first production line, are provided with attachable and detachable sections so as to face the attachable and detachable sections of the first production line, and mount components supplied from feeders mounted on the attachable and detachable sections on the board;

a first feeder exchange device configured to move in an alignment direction of each component mounting machine of the first production line and exchange a feeder by attaching and detaching the feeder to and from the attachable and detachable section of each component mounting machine of the first production line;

a second feeder exchange device configured to move in an alignment direction of each component mounting machine of the second production line at an interval that allows the second feeder exchange device to pass by the first feeder exchange device and exchange a feeder by attaching and detaching the feeder to and from the attachable and detachable section of each component mounting machine of the second production line; and an intrusion detecting sensor configured to detect an intrusion of a person into a region which is surrounded by the first production line and the second production line, wherein when the intrusion of the person is detected by the intrusion detecting sensor, the first feeder exchange device and the second feeder exchange device stop at an interval of a predetermined distance or more from each other in the board conveyance direction.

* * * * *